(12) United States Patent
Ishino

(10) Patent No.: US 6,697,392 B2
(45) Date of Patent: Feb. 24, 2004

(54) SINGLE WAVELENGTH LASER MODULE

(75) Inventor: Masato Ishino, Shijonawate (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/323,164

(22) Filed: Dec. 18, 2002

(65) Prior Publication Data

US 2003/0123498 A1 Jul. 3, 2003

(30) Foreign Application Priority Data

Dec. 18, 2001 (JP) ........................................ 2001-385024

(51) Int. Cl.[7] ................................................. H01S 3/10
(52) U.S. Cl. .............................. 372/22; 372/92; 372/64; 372/6
(58) Field of Search ............................... 372/22, 92, 64, 372/6

(56) References Cited

U.S. PATENT DOCUMENTS

| | | | | |
|---|---|---|---|---|
| 5,082,340 A | * | 1/1992 | Aoshima et al. | 359/328 |
| 5,119,228 A | * | 6/1992 | Fang | 359/245 |
| 5,197,072 A | * | 3/1993 | Harada et al. | 372/21 |
| 5,317,666 A | * | 5/1994 | Agostinelli et al. | 385/122 |
| 5,333,231 A | * | 7/1994 | Fukuda et al. | 385/122 |
| 5,452,312 A | * | 9/1995 | Yamamoto et al. | 372/5 |
| 5,513,196 A | * | 4/1996 | Bischel et al. | 372/22 |
| 5,644,584 A | * | 7/1997 | Nam et al. | 372/20 |
| 5,734,494 A | * | 3/1998 | Xu et al. | 359/332 |
| 5,898,718 A | * | 4/1999 | Mohatt et al. | 372/22 |
| 2002/0009102 A1 | * | 1/2002 | Hayakawa | 372/22 |
| 2002/0061033 A1 | * | 5/2002 | Kitaoka et al. | 372/5 |
| 2002/0141040 A1 | * | 10/2002 | Fujiura et al. | 359/326 |
| 2003/0123498 A1 | * | 7/2003 | Ishino | 372/21 |
| 2003/0128414 A1 | * | 7/2003 | Watanabe et al. | 359/237 |

* cited by examiner

Primary Examiner—Leon Scott, Jr.
(74) Attorney, Agent, or Firm—Merchant & Gould P.C.

(57) ABSTRACT

A single wavelength laser module utilizes difference-frequency light and includes a first laser device for oscillating light having a first wavelength and a second laser device arranged parallel to the first laser device for oscillating light having a second wavelength, an optical waveguide device arranged next to the output ends of the first and the second laser device, and an output optical fiber arranged next to the output end of the optical waveguide device. The optical waveguide device includes a coupling waveguide region and an optical wavelength conversion region. The coupling waveguide region combines light having the first wavelength and the second wavelength into a single waveguide by being optically coupled directly to the first and the second laser device. The optical wavelength conversion region includes an optical waveguide for generating difference-frequency light between the first wavelength and the second wavelength. The coupling waveguide region is coupled optically to the optical wavelength conversion region. The optical fiber is optically coupled directly to the optical waveguide of the optical waveguide device. This laser module can provide sufficient optical output without an isolator and can be mounted easily with a simple configuration.

6 Claims, 4 Drawing Sheets

SINGLE WAVELENGTH LASER MODULE

BACKGROUND OF THE INVENTION

1. Field of the Invention

The present invention relates to a light source for broadband light modulation in an optical communication system that utilizes wavelength division multiplexing or time division multiplexing. Specifically, the present invention relates to a laser module that combines two laser beams with different wavelengths so as to cause a difference frequency effect in a nonlinear optical medium and thereby generate light having a longer wavelength than that of the two laser beams.

2. Description of the Related Art

A laser module that includes a distributed feedback type semiconductor laser (referred to as DFB laser in the following) or a distributed Bragg reflection type laser (referred to as DBR laser in the following) mounted in a package has been used as a single wavelength laser. For the DFB laser and the DBR laser, noise increases significantly with return light reflected by transmission lines or the like. Therefore, an optical isolator is inserted generally into the optical axis in the package to prevent the return light from reaching a semiconductor laser. However, such an isolator is expensive and becomes a primary factor in raising the cost of a single wavelength laser.

When two different wavelengths of light are incident on a medium having a secondary nonlinear optical effect, difference-frequency light as well as harmonic light and sum-frequency light are generated, and larger nonlinear light is produced by phase matching. A wavelength conversion device that takes advantage of this effect is known. FIG. 4 shows this kind of wavelength conversion device, which uses control light to convert the wavelength of signal light that represents information into another wavelength. For convenience, a wavelength conversion device that mainly utilizes a difference frequency generation effect will be described in the following.

The wavelength conversion device shown in FIG. 4 includes a coupler 63, an optical waveguide 62, and a splitter 64. The coupler 63 combines incident light A having a wavelength of $\lambda 1$ and incident light B having a wavelength of $\lambda 2$. The optical waveguide 62 is formed of a nonlinear optical material 61 and has a polarization inversion structure for phase matching. The splitter 64 separates difference-frequency light C. The incident light A of $\lambda 1$ and the incident light B of $\lambda 2$ are combined by the coupler 63 and enter the nonlinear optical waveguide 62. In the optical waveguide 62, difference-frequency light C having another wavelength $[\lambda 3=1.24/(1.24/\lambda 1-1.24/\lambda 2)]$ is generated by the nonlinear optical effect and then emitted from the optical waveguide 62, together with the incident light. The splitter 64 cuts off the light other than the difference-frequency light C.

For example, when $\lambda 1$ is 0.76 μm and $\lambda 2$ is 1.49 μm, the difference-frequency light C having a wavelength $\lambda 3$ of 1.55 μm can be generated as signal light.

Among wavelength conversion devices that utilize the nonlinear optical effect, the highest efficiency of wavelength conversion can be achieved by an optical wavelength conversion device composed of a periodic polarization inversion layer in the shape of stripes that is formed on a LiTa(1−x)NbxO$_3$ (0≦x≦1) substrate and an optical waveguide. The conversion efficiency increases in proportion to the square of the power of the incident light. For example, when both the incident light A (0.76 μm) and the incident light B (1.48 μm) enter the optical waveguide at 10 mW, the power of the difference-frequency light C having a wavelength of 1.55 μm is 0.4 mW. In contrast, when both the incident light A (0.76 μm) and the incident light B (1.48 μm) enter the optical waveguide at 50 mW, the power of the difference-frequency light C having a wavelength of 1.55 μ/m is raised significantly to 10 mW.

Such difference-frequency light is not converted into the original wavelength even if it is reflected by a reflection point of the transmission line and returns to the waveguide. Therefore, the noise of a laser (also referred to as LD in the following) is not increased, so that this module can eliminate the need for an optical isolator.

To introduce a semiconductor laser beam efficiently to the optical waveguide 62, however, a module having the configuration shown in FIG. 4 requires a long time for alignment with a lens. This leads to an increase in the number of optical components and makes mass production difficult. Therefore, even if the isolator is removed, the cost is not reduced.

Further, in the case of a laser module having the configuration shown in FIG. 4, laser beams emitted from a light source are collimated by a collimator lens, then multiplexed by the coupler 63, and directed into the optical waveguide 62 by a focusing lens. This configuration is very complicated, and the average coupling efficiency of two wavelengths is only 50% or less due to wavelength aberration of the focusing lens. Thus, even if the laser output is 150 mW, both wavelengths of light enter the waveguide only at 75 mW or less, resulting in the difference-frequency light of 22.5 mW at the most.

SUMMARY OF THE INVENTION

Therefore, with the foregoing in mind, it is an object of the present invention to provide a single wavelength laser module that utilizes difference-frequency light, can provide sufficient optical output without an isolator, and can be mounted easily with a simple optical system.

A single wavelength laser module of the present invention includes the following: a first laser device for oscillating a laser beam having a first wavelength; a second laser device arranged parallel to the first laser device for oscillating a laser beam having a second wavelength; an optical waveguide device arranged next to the output ends of the first laser device and the second laser device; and an output optical fiber arranged next to the output end of the optical waveguide device. The optical waveguide includes a coupling waveguide region and an optical wavelength conversion region. The coupling waveguide region combines light having the first wavelength and the second wavelength into a single waveguide by being optically coupled directly to the first laser device and the second laser device. The optical wavelength conversion region includes an optical waveguide for generating difference-frequency light between the first wavelength and the second wavelength. The coupling waveguide region is coupled optically to the optical wavelength conversion region. The optical fiber is optically coupled directly to the optical waveguide of the optical waveguide device.

This configuration provides a simple structure and process that only require that the optical waveguide device is mounted before the fiber, and the two-wavelength LDs are mounted before the input waveguides of the optical waveguide device. Thus, laser beams can be introduced and combined with high efficiency in the nonlinear waveguide, and the resultant difference-frequency light can be guided easily to the optical fiber.

In the above configuration, it is preferable that the optical waveguide device has the function of converting a mode size so that the shape of a beam spot is close to the shape of the cross section of a coupling portion between the laser device and the optical waveguide or between the optical waveguide and the optical fiber. This makes it possible to perform coupling and wavelength conversion with even higher efficiency.

A single wavelength laser module having another configuration of the present invention includes the following: a two-wavelength laser array device that includes a first active stripe for oscillating a laser beam having a first wavelength and a second active stripe for oscillating a laser beam having a second wavelength, the first active stripe and the second active stripe being arranged in parallel with a space therebetween; an optical waveguide device arranged next to the output end of the two-wavelength laser array device; and an output optical fiber arranged next to the output end of the optical waveguide device. The optical waveguide device includes a pair of input waveguide ports, a coupling waveguide region, and an optical wavelength conversion region. The pair of input waveguide ports is optically coupled directly to each of the active stripes of the two-wavelength laser array device. The coupling waveguide region combines light having the first wavelength and the second wavelength into a single waveguide. The optical wavelength conversion region includes an optical waveguide for generating difference-frequency light between the first wavelength and the second wavelength. The coupling waveguide region is coupled optically to the optical wavelength conversion region. The optical fiber is optically coupled directly to the optical waveguide of the optical waveguide device.

This configuration further can facilitate a mounting process of the module because the two LDs are mounted on the waveguide at one time.

In the above configuration, it is preferable that a substrate of the two-wavelength laser array device is GaAs, the first active stripe is formed of a layer including GaInNAs, and the second active stripe is formed of a layer including AlGaInP. This makes it possible to produce an arrayed laser without degrading the characteristics of individual lasers.

A single wavelength laser module of yet another configuration of the present invention includes the following: a tandem two-wavelength laser device; an optical wavelength conversion device; and an output optical fiber. The tandem two-wavelength laser device includes a first active stripe for oscillating a laser beam having a first wavelength and a second active stripe for oscillating a laser beam having a second wavelength. The first active stripe and the second active stripe are arranged in series. The optical wavelength conversion device includes an optical waveguide that is optically coupled directly to the stripe of the tandem two-wavelength laser device and generates difference-frequency light between the first wavelength and the second wavelength. The optical fiber is optically coupled directly to the optical waveguide.

This configuration can eliminate a coupler, so that the size of optical components in the module can be reduced further and the module configuration can be made simpler.

In the above configuration, it is preferable that a substrate of the tandem two-wavelength laser device is GaAs, the first active stripe is formed of a layer including GaInNAs, and the second active stripe is formed of a layer including AlGaInP.

DESCRIPTION OF THE PREFERRED EMBODIMENTS

Embodiment 1

Figure 1A:
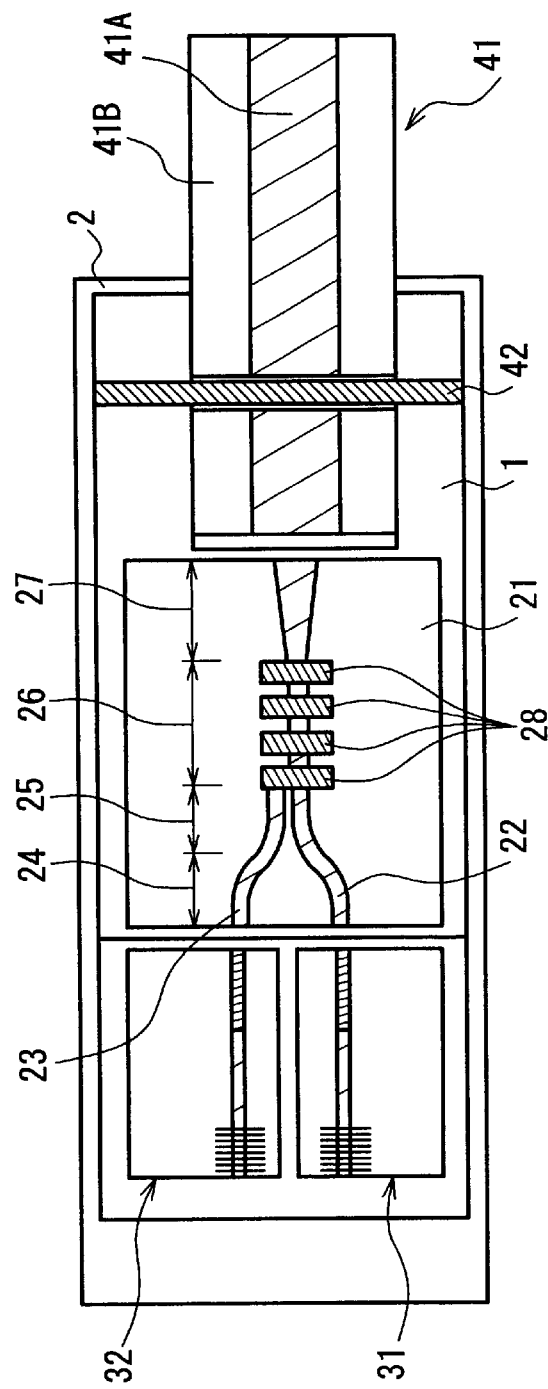
FIG. 1A is a plan view showing a single wavelength laser module of Embodiment 1.
Figure 1B:
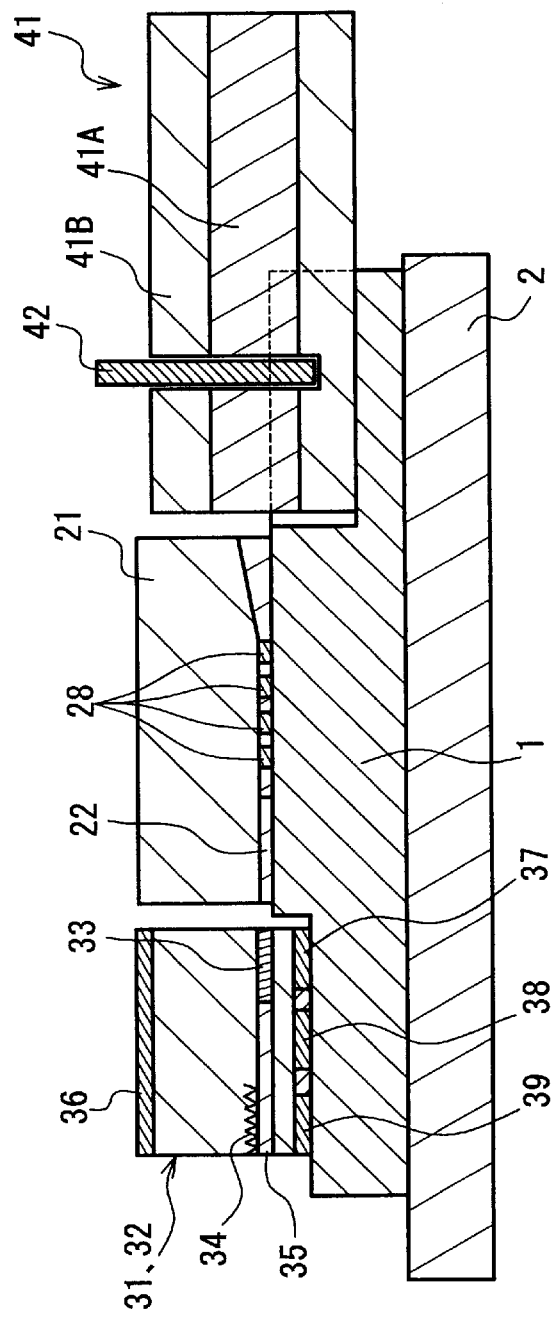
FIG. 1B is a cross-sectional view of the single wavelength laser module in FIG. 1A.

FIGS. 1A and 1B show a single wavelength laser module of Embodiment 1. FIG. 1A is a plan view of the arrangement in the module, and FIG. 1B is a vertical cross-sectional view of the configuration.

As shown in FIG. 1B, chips of DBR-LDs 31, 32 that are arranged upside down and an optical waveguide device that is formed on a $LiNbO_3$ substrate 21 are mounted on a semi-insulating Si substrate 1. A V-groove is provided on the exit side of the substrate 1, which is on the right of the drawing, and a single mode fiber 41 is buried in the V-groove. The single mode fiber 41 includes a core 41A and a cladding 41B. The core diameter is 10 $\mu$m. The single mode fiber 41 has an oblique slit (a vertical slit is illustrated in the drawing for simplification), and a short wavelength cutoff filter 42 is placed in the slit. The short wavelength cutoff filter 42 transmits only difference-frequency light. The Si substrate 1 is mounted on a temperature control device 2.

The DBR-LD 31 is a AlGaAs/GaAs single wavelength laser having a wavelength of 0.76 $\mu$m, and the DBR-LD 32 is a InGaAsP/InP DBR laser having a wavelength of 1.49 $\mu$m. Each of the DBR-LDs includes an active layer 33, a waveguide layer 35, and a diffraction grating 34. The active layer 33 corresponds to an oscillation wavelength. The waveguide layer 35 is transparent to the oscillation wavelength. The diffraction grating 34 is located close to a portion of the waveguide layer 35 and has a pitch for determining the oscillation wavelength. An n-type electrode 36 is formed on the top of the laser chip. A p-type electrode 39 for wavelength adjustment, a p-type electrode 37 for injection, and a p-type electrode 38 for phase matching are formed at the bottom of the laser chip. The p-type electrode 39 is placed under the diffraction grating 34, the p-type electrode 37 is placed under the active layer 33, and the p-type electrode 38 is placed between the two electrodes 37, 39 to maintain a single wavelength. This makes it possible to change the wavelength by about 10 nm while maintaining single wavelength oscillation. In this embodiment, a DFB laser can be used instead of the DBR laser. Moreover, the electrodes may have the opposite polarity.

The optical waveguide device includes a waveguide 22 that is formed on the $LiNbO_3$ substrate 21 by proton exchange. The waveguide 22 is coupled directly to the DBR-LD 31 and the single mode fiber 41 without requiring a lens. The $LiNbO_3$ substrate 21 includes an input region 24 that includes an entrance end and curved waveguides, a coupling region 25 that includes a directional coupler, a difference frequency generation region 26 that includes a polarization inversion region used for phase matching to generate the difference frequency, and an output region 27 where the mode size is converted to achieve a high-efficiency coupling with the fiber.

In the input region 24, the waveguide 22 has a width of 2 μm and a depth of 1 μm, taking into account mode matching with the laser. In the output region 27, the width and the depth are increased respectively to 6 μm by a multistage ion-exchange technique, so that the mode matching is established between the waveguide 22 and the single mode fiber 41. The difference frequency generation region 26 has polarization inversion layers 28 spaced at a period that satisfies the conditions of phase matching between input light and difference-frequency light. Another waveguide 23 is arranged at the input end and coupled directly to the DBR-LD 32 having a wavelength of 1.49 μm. Considering variations in the manufacture of LD chips, the two waveguides 22, 23 are located 50 μm away from each other at the input end, then curved for a distance of 2 mm before reaching the coupling region 25, and coupled so that a space between the waveguides is 3 μm. In the coupling portion, while light having a wavelength of 0.76 μm travels in a substantially straight line, the power of light having a wavelength of 1.49 μm is transferred to the waveguide 22 by the directional coupler. In this configuration, the power of light having a wavelength of 1.49 μm is transferred from the waveguide 23 to the waveguide 22 over a distance of 1 mm.

When both the DBR-LDs 31, 32 operate at 150 mW, light of 120 mW enters the respective waveguides 22, 23 with a coupling efficiency of 80%. Since the waveguide loss is 0.1 dB, the attenuation of power in the curved region is negligible. On the other hand, since both the waveguides 22, 23 cause 10% loss in the coupling region 25, light of 216 mW enters the difference frequency generation region 26. In this case, difference-frequency light having a power of 46 mW and a wavelength of 1.55 μm can be generated. The loss in the output region 27, i.e., the mode size conversion region, is small, and light of 41 mW can be obtained after coupling to the single mode fiber 41. The short wavelength cutoff filter 42 that is inserted in the slit of the single mode fiber 41 cuts off short wavelengths of not more than 1.50 μm. Therefore, the filter 42 removes the light having wavelengths of 0.76 μm and 1.49 μm and transmits only the light having a wavelength of 1.55 μm. The filter 42 causes 5% loss, and the actual power of light output from the fiber is 39 mW, which is about two times as much as the conventional optical output.

When the wavelength of one laser is set to 0.68 μm by using the InGaP active layer formed on the GaAs substrate and the wavelength of the other laser is set to 1.21 μm by using the InGaAsP active, layer formed on the InP substrate, the similar difference-frequency light can be provided.

The wavelength of incident light can be changed by about 10 nm by adjusting current in the DBR region of the DBR laser, the phase matching region, and the active region. Therefore, the wavelength of the difference-frequency light can be varied from 1.526 μm to 1.578 μm, thus covering a wide wavelength range for D-WDM (dense wavelength division multiplexing) optical transmission.

The modulation can be performed by changing the current to be injected into the two lasers. It is also possible to modulate the difference-frequency light in such a manner that an electrode is formed on the difference frequency generation region 26 of LiNbO$_3$, and the refractive index of this region is changed by using the electrode to cause phase modulation. In this case, the nonlinear effect allows a large-amplitude light modulation to be obtained with a small signal at an ultra-speed of 40 GHz or more. Thus, this configuration can be applied to the field of the optical transmission of very large capacity and the optical transmission of millimeter-wave region.

When light returns from the LiNbO$_3$ waveguide 22 to the DBR-LD 31, where the waveguide 22 is coupled optically to the DBR-LD 31, the noise of incident light may be increased. This results in degradation of the noise characteristics of the output light, i.e., difference-frequency light. The reflection from an incidence plane has a little effect on the noise characteristics because the incidence plane and the end face of the laser device are close enough to form the same resonator. In contrast, the light returning from the output end face of the LiNbO$_3$ waveguide 22 at the right side end of the substrate 21 forms an external resonator and degrades the noise characteristics. The return light to the active layer of the DBR-LD 31 can be suppressed by tilting the output end face of the waveguide 22 by about 3° with respect to a plane perpendicular to the optical axis by oblique polishing. The angle of the oblique polishing should be not less than a critical angle of transverse confinement of the waveguide and not more than a total reflection angle at the exit end face, and generally in the range of 1° to 2°. In this range, no reduction in the coupling efficiency of the waveguide 22 with the fiber 41 is caused. The angle of the oblique polishing may be given within a horizontal plane or within a vertical plane that contains the optical axis. In either case, the same effect can be obtained. The application of non-reflective coating to the end face further can reduce the return light.

Embodiment 2

Figure 2A:
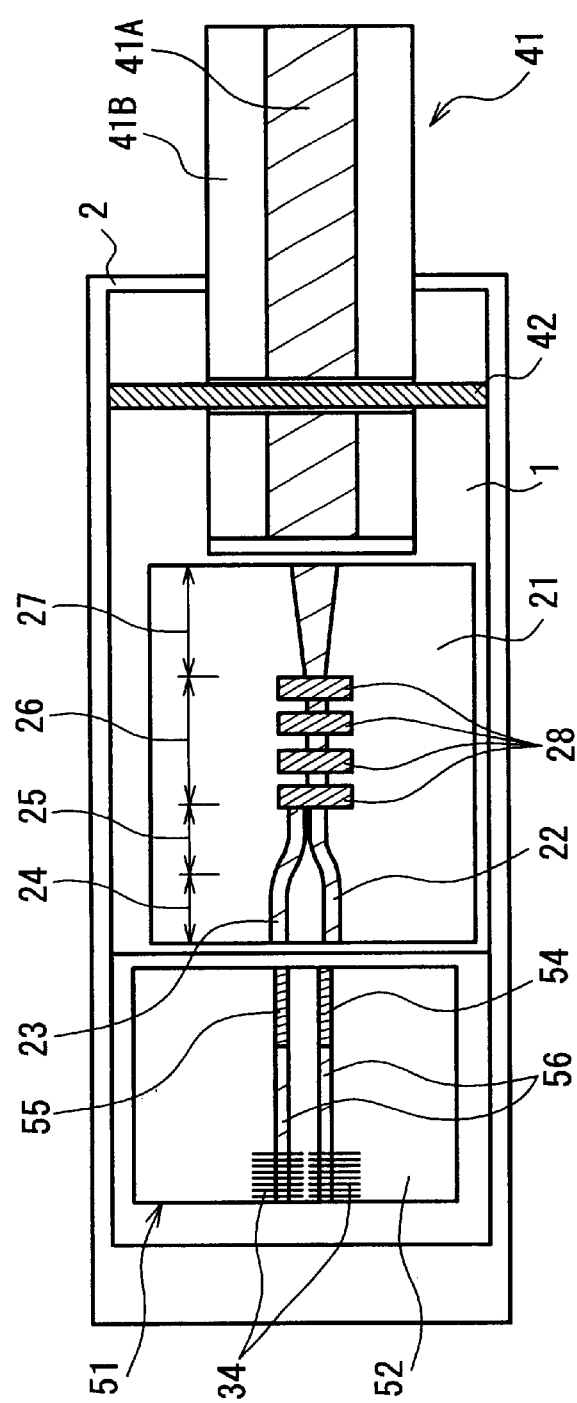
FIG. 2A is a plan view showing a single wavelength laser module of Embodiment 2.
Figure 2B:
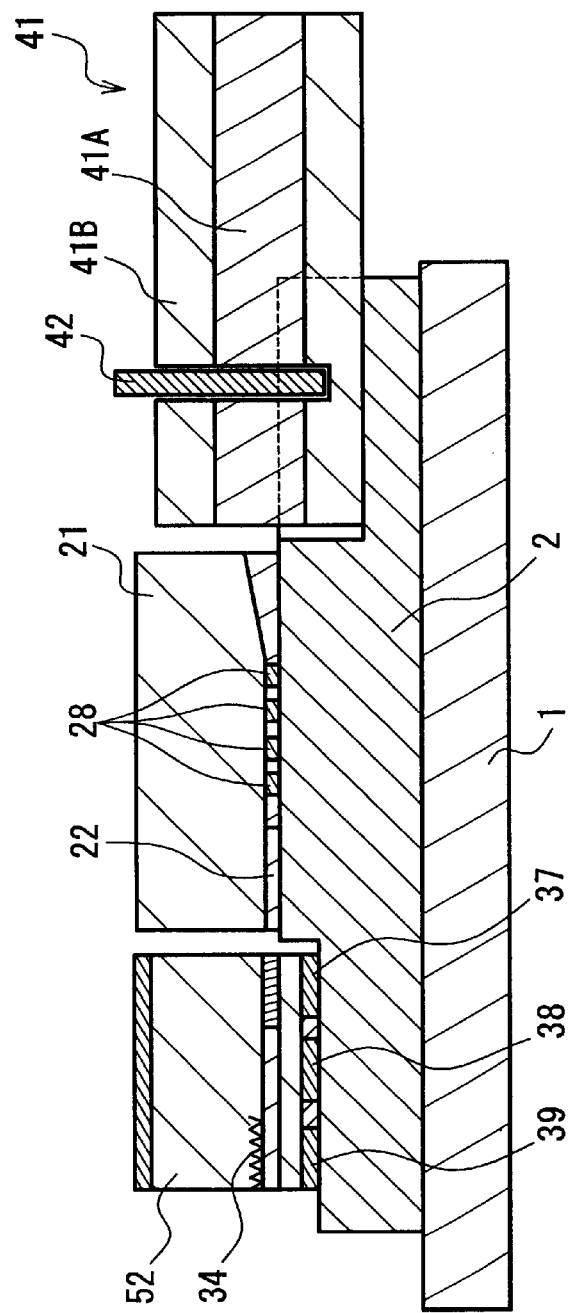
FIG. 2B is a cross-sectional view of the single wavelength laser module in FIG. 2A.

FIGS. 2A and 2B show a single wavelength laser module of Embodiment 2. FIG. 2A is a plan view of the arrangement in the module, and FIG. 2B is a vertical cross-sectional view of the configuration.

This embodiment uses a two-wavelength integrated laser array 51 instead of the DBR-LDs 31, 32 shown in FIGS. 1A and 1B. The two-wavelength integrated laser array 51 is configured so that the active layers of respective lasers with two different wavelengths are formed on the common GaAs substrate 52. The remaining configuration is the same as Embodiment 1. One of the laser stripes is formed of a GaInP active layer 54 and has an oscillation wavelength of 0.65 μm. The other one of the laser stripes is formed of a GaInNAs active layer 55 and has a wavelength of 1.12 μm.

According to this configuration, a high-power two-wavelength laser can be fabricated on the GaAs substrate 52 in a monolithic manner and difference-frequency light having a wavelength of 1.55 μm can be provided. By using this laser array 51, the mounting process for coupling two waveguides 22 and 23 is performed only once, and thus the time required for mounting can be reduced by half. Moreover, the two active stripes of the laser array 51 can be brought close to each other until a space between the stripes is about 10 μm. Therefore, the length of a curved waveguide portion from an input region 24 of the waveguides 22, 23 to a directional coupler 25 on a LiNbO$_3$ substrate 21 can be reduced to 0.4 mm, which in turn reduces the length of the optical waveguide device. Thus, this configuration is more advantageous than Embodiment 1 in achieving smaller size and lower cost of the module. The optical output of the difference-frequency light can be 40 mW, which is nearly the same as that in Embodiment 1.

In this embodiment, noise can be suppressed by tilting the end face of the LiNbO$_3$ waveguide 22 at a small angle with respect to a plane perpendicular to the optical axis. However, when the angle is given within a horizontal plane, there is a limit to the distance between two output ends of the arrayed lasers and the input end of the waveguide, causing a reduction in coupling efficiency. When the angle is given within a vertical plane, such a problem does not occur.

Embodiment 3

Figure 3A:
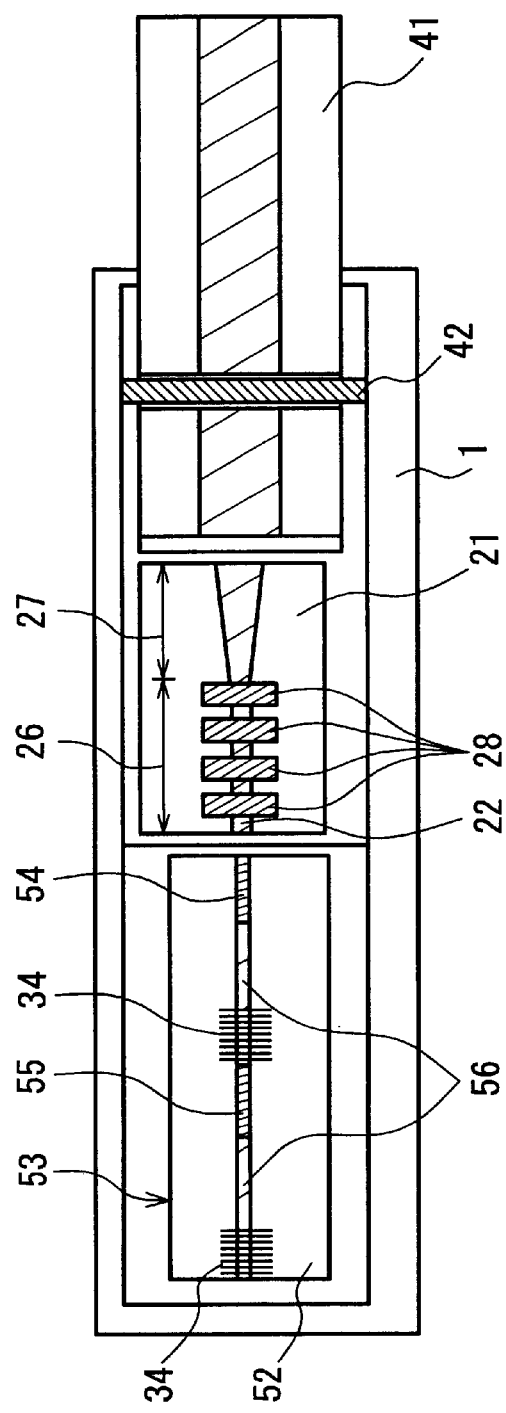
FIG. 3A is a plan view showing a single wavelength laser module of Embodiment 3.
Figure 3B:
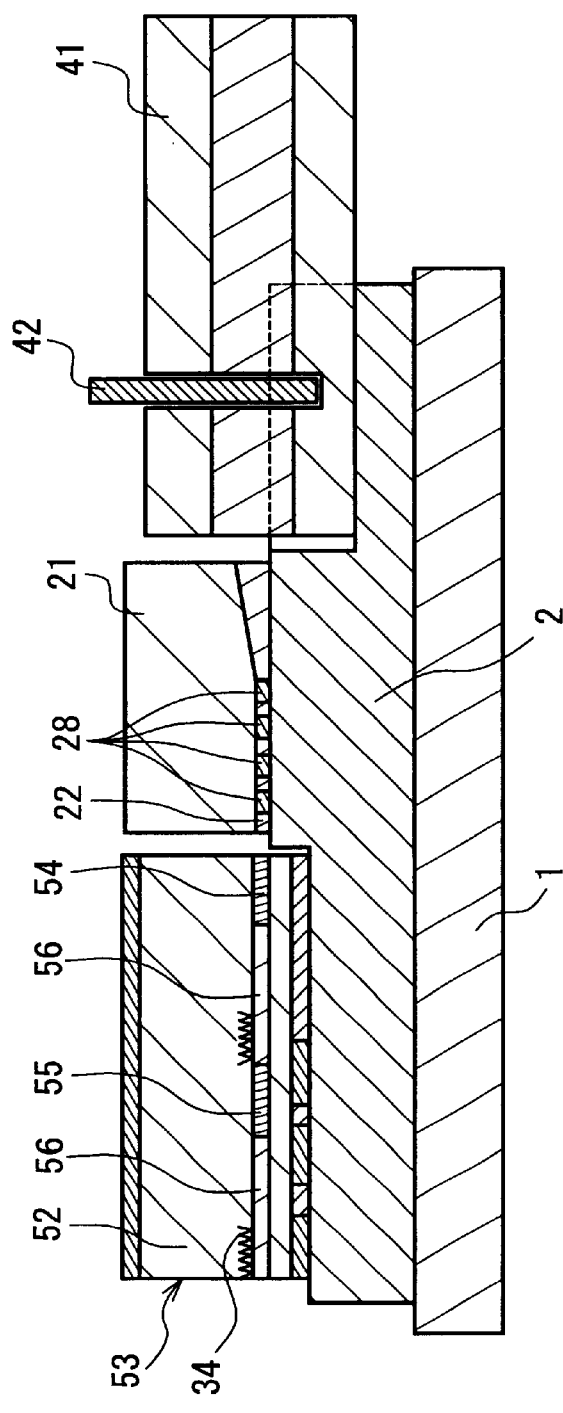
FIG. 3B is a cross-sectional view of the single wavelength laser module in FIG. 3A.
Figure 4:
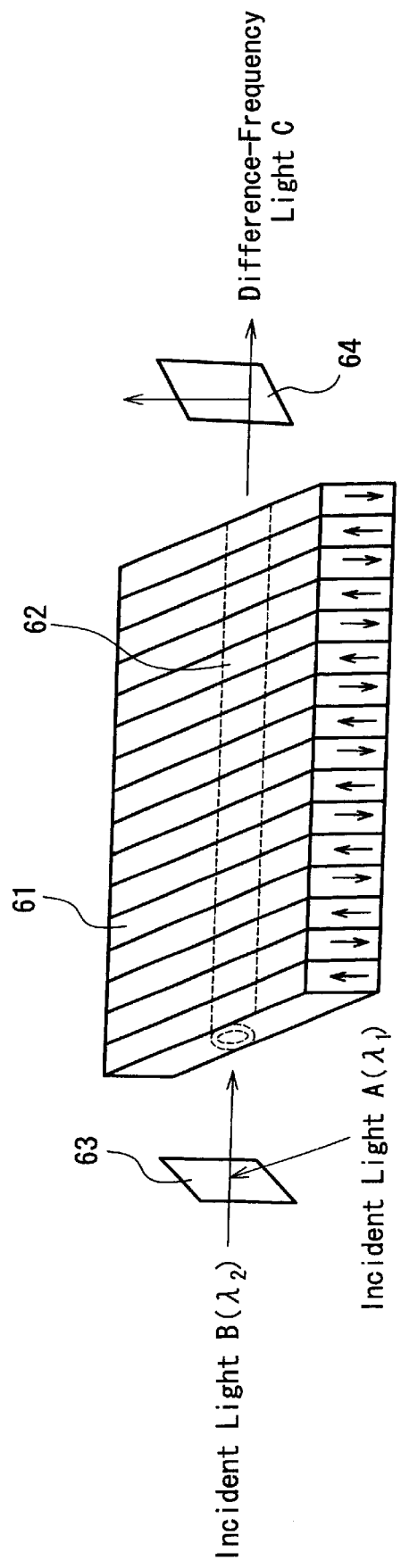
FIG. 4 is a perspective view showing a conventional wavelength converter that utilizes difference frequency generation.

FIGS. 3A and 3B show a single wavelength laser module of Embodiment 3. FIG. 3A is a plan view of the arrangement in the module, and FIG. 3B is a vertical cross-sectional view of the configuration.

This embodiment uses a tandem two-wavelength laser device 53 instead of the two-wavelength integrated laser array 51 shown in FIGS. 2A and 2B. The tandem two-wavelength laser device 53 is configured so that the active layers of respective lasers with two different wavelengths are formed in series on the same GaAs substrate 52. One of the laser stripes is formed of a GaInP active layer 54 and has an oscillation wavelength of 0.65 $\mu$m. The other one of the laser stripes is formed of a GaInNAs active layer 55 and has a wavelength of 1.12 $\mu$m. An optical waveguide device formed on a LiNbO$_3$ substrate 21 has a structure that takes into account the fact that the two-wavelength laser device 53 outputs only one light beam.

The light having a wavelength of 1.12 $\mu$m emitted from the GaInNAs active layer 55 can pass through a AlGaInP waveguide layer 56 and the GaInP active layer 54 with low loss. A laser beam having a wavelength of 0.65 $\mu$m is generated in the GaInP active layer 54. In this case, the laser device 53 outputs two kinds of light: light having a power of 120 mW and a wavelength of 1.12 $\mu$m; and light having a power of 150 mW and a wavelength of 0.65 $\mu$m. Then, power of 80 mW and 120 mW is input to a waveguide 22, respectively. Light emitted from a single mode fiber 41 has a power of 35 mW and a wavelength of 1.55 $\mu$m.

In this configuration, two wavelengths of lights enter directly into a difference frequency generation region 26 of the waveguide 22, so that a coupler is not necessary. Therefore, it is possible to further reduce the size of optical components in the module and to simplify the module configuration.

Both InGaP and GaInNAs on the GaAs substrate can form favorable crystals, and thus their characteristics are not degraded due to integration. Moreover, the optimization can be achieved more easily because of a single coupling portion between the laser and the waveguide.

In this embodiment, noise can be suppressed by tilting the end face of the LiNbO$_3$ waveguide 22 at a small angle with respect to a plane perpendicular to the optical axis. When the angle is given within either horizontal plane or vertical plane, the same effect can be obtained.

Each of the above embodiments employs materials suitable for oscillation wavelengths of 1.12 $\mu$m and 0.65 $\mu$m. For shorter wavelengths, the AlGaInP active layer is used and any combination can be applied. For example, when the oscillation wavelength of the AlGaInP active layer is 0.60 $\mu$m, difference-frequency light having a wavelength of 1.31 $\mu$m can be provided. The cladding can be formed of AlGaInP in any case, and the same effect can be obtained by using AlGaAs in the case of the GaInNAs active layer.

In the above embodiments, only LiNbO$_3$ is exemplified as a nonlinear optical material. However, any materials may be used as long as they can have a nonlinear effect and a polarization inversion structure, like other dielectric materials such as LiTaO$_3$ and semiconductors such as GaAs.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A single wavelength laser module comprising:
    a first laser device for oscillating a laser beam having a first wavelength;
    a second laser device arranged parallel to the first laser device for oscillating a laser beam having a second wavelength;
    an optical waveguide device arranged next to output ends of the first laser device and the second laser device; and
    an output optical fiber arranged next to an output end of the optical waveguide device,
    wherein the optical waveguide device comprises:
        a coupling waveguide region that combines light having the first wavelength and the second wavelength into a single waveguide by being optically coupled directly to the first laser device and the second laser device; and
        an optical wavelength conversion region that comprises an optical waveguide for generating difference-frequency light between the first wavelength and the second wavelength, and
        the coupling waveguide region is coupled optically to the optical wavelength conversion region, and
    wherein the optical fiber is optically coupled directly to the optical waveguide of the optical waveguide device.

2. The single wavelength laser module according to claim 1, wherein the optical waveguide device has a function of converting a mode size so that a shape of a beam spot is close to a shape of a cross section of a coupling portion between the laser device and the optical waveguide or between the optical waveguide and the optical fiber.

3. A single wavelength laser module comprising:
    a two-wavelength laser array device comprising a first active stripe for oscillating a laser beam having a first wavelength and a second active stripe for oscillating a laser beam having a second wavelength, the first active stripe and the second active stripe being arranged in parallel with a space therebetween;
    an optical waveguide device arranged next to an output end of the two-wavelength laser array device; and
    an output optical fiber arranged next to an output end of the optical waveguide device,
    wherein the optical waveguide device comprises:
        a pair of input waveguide ports that is optically coupled directly to each of the active stripes of the two-wavelength laser array device;
        a coupling waveguide region that combines light having the first wavelength and the second wavelength into a single waveguide; and
        an optical wavelength conversion region that comprises an optical waveguide for generating difference-frequency light between the first wavelength and the second wavelength, and
        the coupling waveguide region is coupled optically to the optical wavelength conversion region, and
    wherein the optical fiber is optically coupled directly to the optical waveguide of the optical waveguide device.

4. The single wavelength laser module according to claim 3, wherein a substrate of the two-wavelength laser array device is GaAs, the first active stripe is formed of a layer including GaInNAs, and the second active stripe is formed of a layer including AlGaInP.

5. A single wavelength laser module comprising:
a tandem two-wavelength laser device comprising a first active stripe for oscillating a laser beam having a first wavelength and a second active stripe for oscillating a laser beam having a second wavelength, the first active stripe and the second active stripe being arranged in series;
an optical wavelength conversion device comprising an optical waveguide that is optically coupled directly to the stripe of the tandem two-wavelength laser device and generates difference-frequency light between the first wavelength and the second wavelength; and
an output optical fiber optically coupled directly to the optical waveguide.

6. The single wavelength laser module according to claim 5, wherein a substrate of the tandem two-wavelength laser device is GaAs, the first active stripe is formed of a layer including GaInNAs, and the second active stripe is formed of a layer including AlGaInP.

* * * * *